US008131232B2

(12) United States Patent
Muhammad

(10) Patent No.: US 8,131,232 B2
(45) Date of Patent: Mar. 6, 2012

(54) METHOD AND APPARATUS FOR ANTENNA TUNING

(75) Inventor: Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 328 days.

(21) Appl. No.: 12/576,317

(22) Filed: Oct. 9, 2009

(65) Prior Publication Data

US 2011/0086600 A1     Apr. 14, 2011

(51) Int. Cl.
*H04B 1/04*     (2006.01)
(52) U.S. Cl. .............. 455/114.2; 455/127.2; 330/86
(58) Field of Classification Search .......... 455/107, 455/114.2, 115.1, 120–126, 127.2, 129; 330/86, 330/105, 110, 143, 282
See application file for complete search history.

(56) References Cited

U.S. PATENT DOCUMENTS

| 6,845,126 B2 * | 1/2005 | Dent et al. ............... 375/219 |
| 6,961,368 B2 | 11/2005 | Dent et al. |
| 2005/0271161 A1 | 12/2005 | Staszewski et al. |

OTHER PUBLICATIONS

R. Novak and T. Ranta, "Antenna Approach Aids Cellular Handsets," Microwaves & RF Magazine, Nov. 2008.

* cited by examiner

*Primary Examiner* — Christian Hannon
(74) *Attorney, Agent, or Firm* — Ronald O. Neerings; Wade James Brady, III; Frederick J. Telecky, Jr.

(57) ABSTRACT

A method for tuning a transmitter in order to improve impedance matching to an antenna or to intermediate radio frequency stages uses an error detector that senses a deviation of the amplitude or phase angle of a load current of a power amplifier driver or of a power amplifier. A controller calculates a correction and dynamically adjusts tunable transmitter parameters, which may include values of components in matching networks or bias voltages in the power amplifier or the power amplifier driver, so as to reduce the deviation and thereby improve the impedance matching. The load current of the power amplifier may alternatively be sensed by measuring the duty cycle of its switching mode power supply. A transmitter having a power amplifier and one or more tunable circuit elements incorporates an error detector that senses the amplitude or phase of a load current and a controller that adjusts one or more tunable parameters to reduce impedance mismatch. An integrated circuit device suitable for use in a transmitter includes a power amplifier driver circuit and a detector circuit capable of sensing a load current, and a controller circuit that can adjust tunable parameters either within or external to the integrated circuit. By eliminating directional couplers and integrating the detectors and power amplifier drivers, the size, complexity, and cost of wireless transceivers can be reduced, while efficiency and power consumption are improved through the dynamic adjustment of operating points and impedance matching.

37 Claims, 8 Drawing Sheets

HAND EFFECT

FREQUENCY (824 TO 894 MHz)

RETURN LOSS OF A GSM850 ANTENNA

METHOD AND APPARATUS FOR ANTENNA TUNING

BACKGROUND OF THE INVENTION

1. Field of the Invention

The present invention relates generally to the field of wireless communications, and more particularly, to a method and apparatus for antenna impedance matching in a wireless communication device.

2. Description of the Related Art

It is well known that impedance matching is required to optimize energy transfer from a source to a load in radio-frequency circuits. In radio communication devices such as wireless transceivers, there are several places within the system requiring impedance matching, but one of the most challenging is the connection between a transmitter as a source and an antenna as a load. A poor impedance match in this part of a transceiver system results in the inefficient transfer of power to the antenna, and thus requires more power, for example from a battery in a portable system, in order to achieve a given level of radiated power needed for a robust communication link. A similar situation occurs between an antenna as a source and a receiver as a load, but mismatch in this path, while resulting in poorer received signal quality, does not have as direct an impact on power consumption of the transceiver. A parameter commonly specified to indicate the degree of mismatch is the voltage standing wave ratio (VSWR). An ideal VSWR of 1.0:1 indicates no mismatch (perfect matching) and no reflected power from a load.

Antenna matching is becoming more challenging in modern mobile wireless devices, which are supporting a growing range of services and frequencies beyond cellular telephony, including wireless local area networks (WLAN), personal area networks such as Bluetooth, mobile television protocols, and Global Positioning Systems (GPS). Miniature antennas are being asked to cover frequencies ranging from 824 to 2170 MHz and more in order to perform all these functions. Simultaneously, smaller batteries and longer battery life are desired in increasingly miniaturized, handheld packages, in which the antenna must be fit into available space and close to the outside of the housing, where it is susceptible to environmental effects. In mobile and handheld devices, the effective impedance of the antenna is not a constant, but continually changes as an operator walks, drives, changes hand position, or holds the antenna against his or her head or body. The impedance changes as power radiated from the antenna is reflected back by objects in the near vicinity. Although most RF components are designed to operate at a SWR of 1.0:1, in modern designs, an antenna VSWR of between 2.0:1 and 3.0:1 is usually specified as the compromise design match allowed by the constraints of available antennas and the various conflicting requirements. During operation of a handheld device, VSWR may degrade to as high as 9.0:1 without dynamic tuning of the impedance matching conditions, resulting in significant signal loss and power inefficiency. Thus a fixed impedance matching network is unable to maintain an optimal match over various orientations of the phone and environments around the phone, and methods are being developed to implement adaptive tunable matching networks with closed-loop control to dynamically adjust the tuning. Often different frequencies are used for transmit and receive functions, further complicating the impedance matching task by demanding either fast switching between transmit and receive configurations, by requiring simultaneous optimization for both transmit and receive using duplicate components, or by accepting a compromise between transmit and receive. Independent tunable matching networks could be implemented for the transmit and receive functions, but this would incur twice the cost. This is undesirable, because in addition to improvements in performance and miniaturization, there is also pressure for designs to achieve continual cost reductions.

A number of solutions for dynamic impedance matching in wireless transceivers have been suggested. Handset designers have experimented with microelectromechanical systems (MEMS) technology to implement RF switches or tunable capacitors. Nonlinear capacitors using nonlinear ferroelectric dielectric materials such as barium strontium titanate (BST) can be tuned using a bias voltage. Both of these tunable components require high bias voltages to tune, up to 30 V or higher, requiring additional DC-to-DC converters to multiply the battery voltage, and cannot be easily integrated with RF, analog, and digital circuitry on the same die. Digitally-tunable capacitors (DTCs) have also been proposed for integration on silicon on sapphire substrates. These various tunable components can be incorporated into tunable antennas and filters, but they require high RF power handling capability in the transmit path after the power amplifier and leading to the antenna. Moreover, in themselves they do not provide the sensing mechanism to detect the VSWR that is needed to determine the desired settings for the tunable devices. Thus another component is needed, such as a directional coupler that can pick off both forward and reflected signals from a transmission line. The signal from the directional coupler is interpreted by an electronic circuit to close the tuning loop. The tuning controls are adjusted electronically though a control loop such that the reflected power is reduced to a minimum while the forward power is maximized. These tuning and control circuits are either designed in the same substrate/process as the power amplifier or on one or more independent ICs. Directional coupler structures take up precious space, either as separate components, or as incorporated into the transmission lines on a printed circuit board.

Examples of existing solutions for the detection and tuning of antenna mismatch are described in U.S. Pat. No. 6,845,126 to P. W. Dent and R. A. Dolman, issued Jan. 18, 2005 (hereinafter, "the '126 patent"), U.S. Pat. No. 6,961,368 also to P. W. Dent et al., issued Nov. 1, 2005 (hereinafter, "the '368 patent"), and an article by R. Novak and T. Ranta, "Antenna Tuning Approach Aids Cellular Handsets," in Microwaves & RF magazine, November 2008 (available online at http://www.mwrf.com/Index.cfm?ArticleID=20085). In the '126 patent, a directional coupler is used to direct reflected signals to a homodyne receiver that down-converts the reflected signals to baseband to detect the antenna mismatch during a transmit mode and down-converts the received signals during a receive mode. The down-converted reflected signals are used in a baseband processor to generate control signals for a programmable matching network. In the '368 patent, a directional coupler is also employed to pick off a reflected signal for an impedance mismatch measuring and quantizing unit to use in configuring an adjustable matching network and various switches. Novak and Ranta describe digitally tunable capacitors integrated using silicon on sapphire substrates as an alternative to MEMS and BST capacitors, and also assume the use of a directional coupler to pick off from the antenna forward and reflected signals whose powers are then detected. These existing solutions all require additional complexity, and therefore cost, in the form of additional separately-packaged components to separate and sense the forward and reflected signals from the antenna, as well as to perform an adjustment of the impedance feeding the antenna.

There is accordingly a need to further improve the detection of antenna impedance mismatch in wireless transceivers, as well as to implement new solutions for adjusting the impedance, thereby improving power consumption and thus battery life, especially in handheld transceivers. Tunable impedance also simplifies the design of the power amplifier and its housing to dissipate heat, as the total radiated power requirement can be met by antenna tuning rather than by using the brute-force approach of increasing the output power to make up for the loss of radiated power due to reflected power. It is particularly desirable to find solutions that can be integrated into multifunction integrated circuits, thereby reducing size, eliminating components and thus lowering the cost.

SUMMARY OF THE INVENTION

These and other problems associated with the prior art are addressed by the present invention, which provides a method and apparatus for antenna tuning that can be integrated with existing power amplifier driver circuits in a wireless transceiver. RF load currents of the power amplifier driver, or the power amplifier itself, or both, are detected by an error detector. Error detectors are provided that are capable of sensing either the amplitude of a load current or the relative phase between the load current and its corresponding voltage. The amplitude and/or phase information related to these load currents are used to determine the variation from a reference matching condition. These load currents are indicators of how efficient the coupling is to the next stage or antenna, in that higher amplitude drive currents are required to achieve the same delivered output level in the presence of higher mismatch, and a larger phase difference between the current and voltage also corresponds to a greater mismatch. Mismatch at the output of an amplifier appears in a deamplified form at the input of the amplifier, so that, for example, antenna mismatch at the output of the power amplifier appears also as a change in load current at the output of the power amplifier driver stage that precedes the power amplifier. An error signal derived from the detected load current is used by a controller to adjust the operating conditions of the power amplifier driver, the power amplifier, an output matching network between the power amplifier and the antenna, or an intermediate matching network between the power amplifier driver and the power amplifier. The error detector and/or the intermediate matching network may be integrated with the power amplifier driver circuitry and other low-power RF and/or baseband functions. Another type of error detector is also provided that analyzes the duty cycle of a switching mode power supply that supplies the power amplifier, and that can alternatively be used to generate an error signal for input to the controller.

More specifically, the present invention provides a method of tuning a transmitter having a power amplifier driver, a power amplifier, and one or more tunable parameters, with the power amplifier coupled to an antenna. A load current of the power amplifier driver is detected, and an error signal indicating a deviation from a reference condition related to antenna impedance matching is derived. A correction is calculated based upon the error signal, and one or more of the tunable parameters of the transmitter are adjusted so as to reduce the deviation from the reference condition.

The present invention also provides a transmitter having one or more tunable circuit elements and an associated antenna. The transmitter has a power amplifier driver, the output of which is coupled to the input of a power amplifier through an optional matching network. The output of the power amplifier is coupled to the antenna. A detector is configured to sense a load current of either the power amplifier driver or the power amplifier, or of both, and the detector is also configured to generate an error signal that indicates a deviation of the load current from a predetermined value. The error signal is sent to a controller that calculates a correction based on the error signal, and that adjusts one or more parameters of the tunable circuit elements in such a way as to reduce the impedance mismatch between the transmitter and the antenna.

The present invention additionally provides an integrated circuit device that may be used in a transmitter system having one or more tunable parameters, a power amplifier and an antenna. The integrated circuit device includes a power amplifier driver circuit, and a detector circuit configured to sense a load current of the power amplifier driver and to generate an error signal that indicates the deviation from a predetermined impedance matching condition. A controller circuit connected to the output of the detector circuit adjusts the tunable parameters so as to reduce the deviation from the predetermined impedance matching condition.

Significant advantages over the prior art are provided by the present invention. By eliminating the directional coupler commonly used in mismatch sensors, the size, cost, and insertion loss of a transmitter may be reduced by the present invention, and more components may be integrated together. In some applications, one or both of the output or intermediate matching networks can also be eliminated, or replaced by smaller, simpler, and less costly fixed matching networks, with the tunable matching function performed by the adjustment of bias or supply voltages in the power amplifier driver or power amplifier, which by changing the operating points changes the impedance characteristics of the amplifiers. The adjustment of bias voltages and internal circuit parameters may be performed more quickly than switching or tuning of some types of programmable matching networks, enabling fast switching between bands or between receive and transmit operation. Eliminating or integrating components can lead to lower insertion loss as well as lower cost. Lowering insertion loss and improving instantaneous impedance matching conditions through dynamic adjustment both lead to lower power dissipation of the transmitter, and thus result in improved battery life of a system including the transmitter, since the efficiency of coupling to the antenna results in higher radiated power for a given transmitter power level.

Other features and advantages of the present invention will be apparent to those of ordinary skill in the art upon reference to the following detailed description taken in conjunction with the accompanying drawings, and the appended claims.

DESCRIPTION OF THE VIEWS OF THE DRAWINGS

For a more complete understanding of the present invention, and the advantages thereof, reference is now made to the following description taken in conjunction with the accompanying drawings, in which.

DETAILED DESCRIPTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1A:
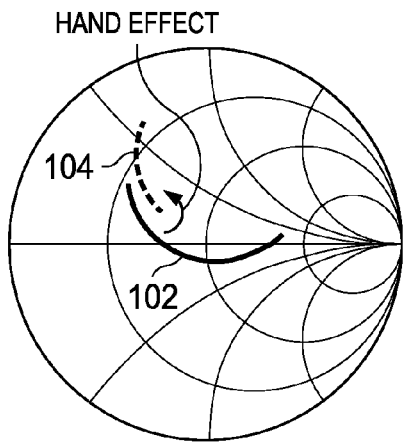
FIG. 1A is a Smith chart showing the shift in impedance of a mobile antenna due to the "hand effect;"
Figure 1B:
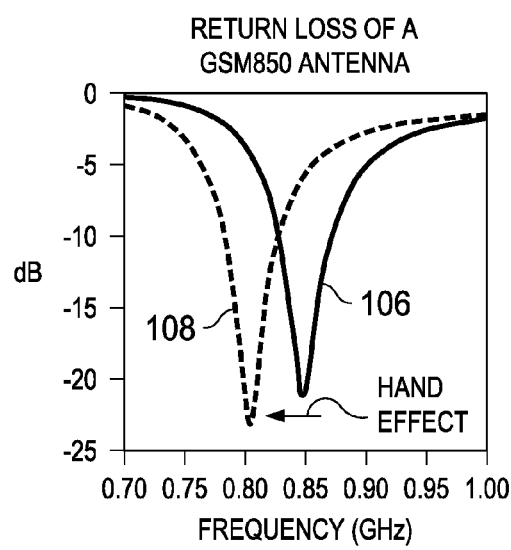
FIG. 1B is a plot of the frequency response of return loss for the same antenna as in FIG. 1A, showing the shift in frequency of the impedance matched condition due to the "hand effect;"

Referring now to FIG. 1A, a Smith impedance chart is shown of an antenna for use in a Global System for Mobile communication handheld device ("handset") operating in the 850 MHz cellular band (GSM850). Curve 102 indicates the impedance of the antenna as a function of frequency over the range 824 to 894 MHz under nominal design conditions. During use, however, a user holds the handset with his or her hand in close proximity to the antenna radiator, and this leads to a shift in the resonance frequency of the antenna, and hence the impedance at a given frequency, which causes the antenna to be badly mismatched at its intended operating frequency. This condition is known as the "hand effect" and is indicated by curve 104, which shows the altered impedance versus frequency curve on the Smith chart. A frequency response plot of return loss of this same antenna showing the shift to a lower resonant frequency is shown in FIG. 1B. Here, curve 106 shows the frequency response of the GSM850 antenna under nominal design conditions, which is well matched at 850 MHz (0.85 GHz) and thus exhibits a maximum return loss of more than 21 dB at that frequency. The "hand effect" shifts the return loss maximum by nearly 50 MHz as shown by curve 108.

Figure 2A:
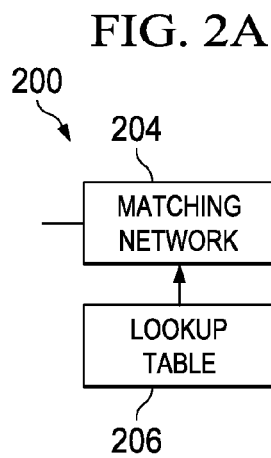
FIGS. 2A and 2B are block diagrams depicting an open-loop and a closed-loop antenna tuner, respectively.

If a programmable or tunable matching network is available, then control schemes are possible that can compensate for changes in the antenna impedance as a function of various conditions. FIG. 2A shows a simplified block diagram of an open-loop control system 200, which may be referred to as an "antenna tuner," that can adjust the effective impedance of antenna 202 at the input of matching network 204 by storing certain operating conditions in a lookup table 206. This type of system is capable of compensating for predictable changes in operating conditions that are known a priori and thus can be calibrated once, with the corrections corresponding to these known conditions stored in lookup table 206. Examples of predictable conditions include changing transmit or receive frequencies, modulation schemes, and handset configuration (open or closed). But an open-loop control system such as 200 is not capable of compensating for unpredictable environmental conditions such as the hand effect, since it does not measure in real time any variable factors directly related to the impedance of the antenna.

Figure 2B:
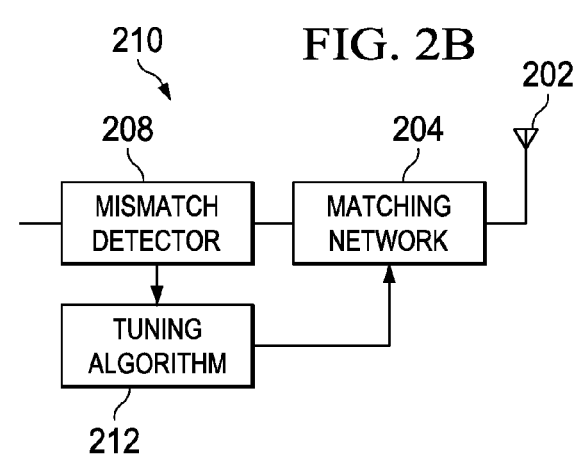

In order to compensate in real time for unpredictable and time-varying environmental fluctuations such as proximity of a user's hand, head, or body, a closed-loop system may be used. FIG. 2B shows a simplified block diagram of a closed-loop antenna tuner control system 210 in accordance with an embodiment of the present invention. In this system, a mismatch detector 208 senses parameters related to the impedance mismatch related to antenna 202 at the input of variable or programmable matching network 204. A control algorithm (called a tuning algorithm) is implemented as schematically indicated by block 212, which takes an error signal output from mismatch detector 208 indicating a degree of deviation of matching from a desired or reference value, and calculates a correction to apply to the parameters of matching network 204. Although the word "algorithm" is used to refer to a control function, the control algorithm is not necessarily implemented in software or firmware; block 212 could alternatively be understood to correspond to a controller implemented by analog or digital control hardware. The present invention concerns itself primarily with alternative implementations of mismatch detectors 208 and alternative ways to adjust the impedance matching characteristics of a transmitter or receiver system. These impedance matching characteristics can be variable parameters of a matching network as specifically indicated in FIG. 2B by matching network 204, or in different embodiments of the present invention, they can be variable parameters of other components such as amplifiers within a transmitter, receiver, or transceiver system.

In a receiver, antenna mismatch affects the thermal noise figure, which in a common interference limited cellular scenario is not the limiting factor of receiver performance. However, antenna mismatch has a direct impact on total radiated power (TRP) at a given setting of transmitter power amplifier gain parameters. Since wireless systems commonly implement system-level control of interference and other radio transmission characteristics using dynamic radio resource management (RRM) to form an outer feedback loop, a lowering in TRP will often be accompanied by a request by a base station to increase transmit power in the handset. Thus operating at lower radiated efficiency results in operation at higher drive power levels and consequently in reduced battery life of the handset. Hereinafter, because of the primary importance of antenna impedance matching to radiated power, efficiency, and battery life, the term "transmitter" will be used in place of "transmitter, receiver, or transceiver" when referring to embodiments and system applications of the present invention.

Figure 3:
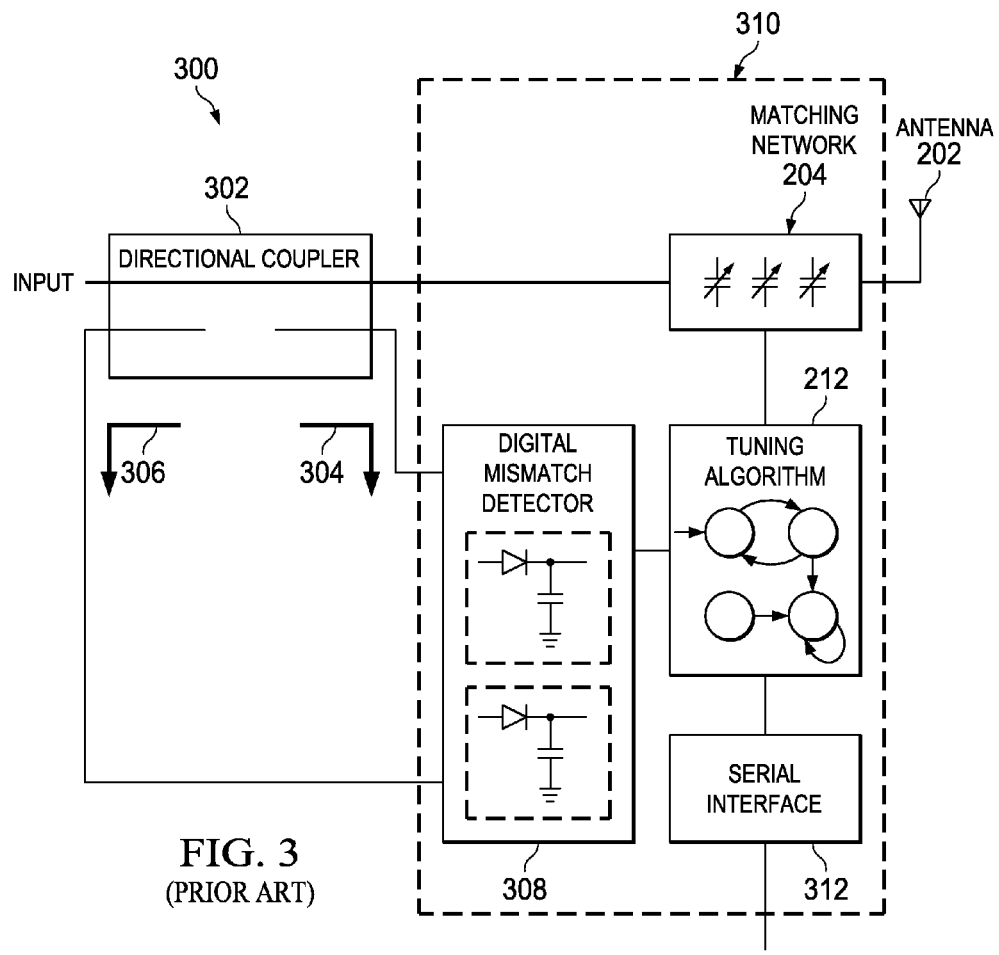
FIG. 3 is a schematic block diagram of a conventional closed-loop antenna tuner.

FIG. 3 depicts a schematic block diagram of a conventional closed-loop antenna tuner 300 from the prior art, showing details of one method of implementing a mismatch detector and matching network using recent technology. In this example, a programmable matching network 204 is shown as containing a number of variable or programmable capacitors. The matching network 204 may be included in an integrated subsystem 310 that also includes a controller 212 containing hardware and perhaps software for implementing the tuning algorithm, as well as parts of a mismatch detector, shown as a "digital mismatch detector" block 308, with two power sensors each schematically indicated within block 308 by a simple diode and capacitor circuit. These two power sensors are fed a forward signal 304 and a backward signal 306 that are portions of forward and reflected signals picked off from the main line feeding the input of the matching network 204 by directional coupler 302. Alternate implementations could detect total power and reflected power to deduce forward power. Communication to the rest of the transceiver system, for example to adjust control parameters or to select modes of operation, is offered by serial interface 312 integrated into the subsystem or integrated circuit 310. Disadvantages of this conventional tuner include needing a separate directional coupler component 302 that adds complexity and size, as well as additional insertion loss in the high-power transmit path. It may also be difficult to integrate matching networks 204 using conventional integrated circuit technology, necessitating the use of more expensive insulating substrates or lower-density hybrid package integration.

Figure 4:
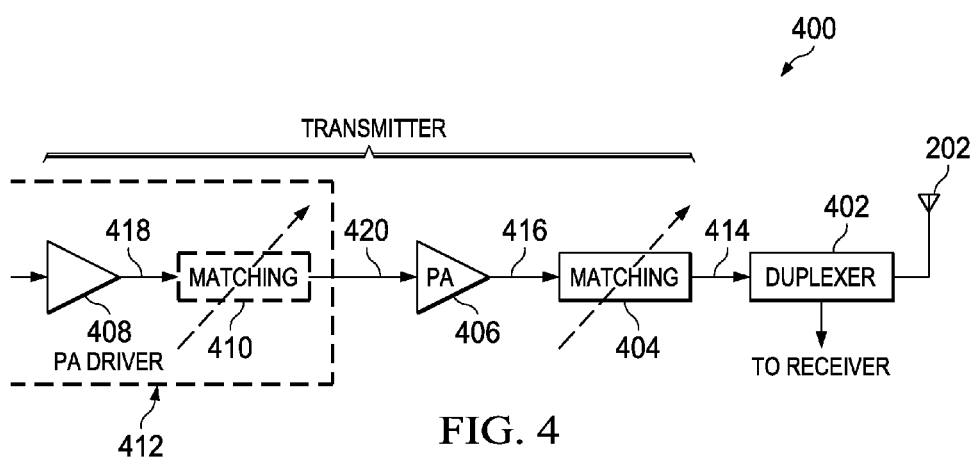
FIG. 4 is a schematic diagram depicting a portion of a transmitter according to an embodiment of the present invention.

Referring now to FIG. 4, a schematic diagram is shown that depicts a portion of a transmitter 400 according an embodiment of the present invention. In a transceiver system, an optional duplexer 402 may be used to share a single transmit/receive antenna 202 between the transmitter 400 and receiver (not shown). Such a duplexer 402 may comprise a surface acoustic wave (SAW) filter, or may not be used at all in the case of a system containing separate transmit and receive antennas. In the illustrated exemplary embodiment, an output matching network 404 is shown in the high-power transmit path between a power amplifier 406 and the antenna 202. Output matching network 404 is optionally programmable, variable, or tunable as indicated by the dashed arrow. An optional intermediate matching network 410 is shown in the lower-level signal path between power amplifier driver circuit 408 and power amplifier 406. The intermediate matching network 410 is also optionally tunable or programmable to vary its input and output impedance properties. The power amplifier driver 408 and intermediate matching network 410 are shown as being optionally integrated together, perhaps with other functions, in an integrated circuit or subsystem 412. Subsystem 412 is indicated by a dashed line around power amplifier driver 408 and intermediate matching network 410 that is open at the left hand side to imply that other lower-level signal generation and processing functions or circuits may also be included in block 412. Circuit nodes 414, 416, 418, and 420 are labeled in the transmit signal path for future reference herein.

An impedance mismatch in a circuit feeding antenna 202 results in a reflected wave returning toward the input of the circuit. Assume without loss of generality that duplexer 402 is perfectly impedance matched at all frequencies to antenna 202. This is equivalent to saying that the duplexer is removed from the circuit. (If duplexer 402 is not impedance matched to the antenna, then the duplexer/antenna combination can simply be viewed together for the purposes of this analysis as an antenna with a different impedance characteristic.) Then node 414 represents the antenna input. If output matching network 404 perfectly matches the antenna input, then the input impedance at node 416, the input of the output matching network, will appear to be a purely resistive impedance with no reactive part. This resistance is commonly chosen to be 50 ohms for radio frequency (RF) circuits. Thus power amplifier 406 is commonly designed to drive a nominal 50 ohm load, and driving such a load results in complete power transfer to the load without reflections. An imperfect match at the node 416 results in inefficient power coupling to the load, and a different amplitude and phase of the voltage and power at 416 for a given input drive level to the power amplifier 406. Moreover, the fact that an amplifier has imperfect input isolation means that a deamplified version of the signal including reflected power at node 416 will appear at input node 420 of power amplifier 406. In particular, any reflected signals resulting from a mismatch in driving antenna 202 will appear at a reduced level at node 420, and thus alter the amplitude and phase of the voltage and current signals at this node with respect to how they would appear for the same drive conditions but with a perfectly matched antenna. Likewise, changes in the load current and voltage will appear upstream of intermediate matching network 410 at node 418, which is the output of power amplifier driver 408. In other words, when the PA output is mismatched, a smaller mismatch is observed at its input as well, due to finite isolation, which appears as a mismatch at the output of the PA driver. Thus an impedance mismatch at the antenna may be detected at any of these intermediate nodes in the signal chain, although with altered amplitude and/or phase.

For reference in later discussion, the following impedances will be defined at the nodes 418 and 420 related to the power amplifier driver output and power amplifier input. Hereinafter, the words "power amplifier" may be abbreviated "PA." The output impedance of PA driver 408 seen looking back into driver 408 from node 418 is $Z_P$. The input impedance of PA 406 seen looking forward into PA 406 from node 420 is $Z_{in}$. The combined impedance of the PA input and an optional intermediate matching network 410 looking forward into intermediate matching network 410 from node 418 comprises a load impedance $Z_L$ that is presented to the PA driver output. Perfect matching at node 418 corresponds to adjusting the impedances of PA driver 408 and/or intermediate matching network 410 such that $Z_P = Z_L$.

In practice, it is difficult to design compact antennas with an impedance of 50 ohms at one frequency, let alone across the entire range of frequencies at which handheld antennas are required to operate. Thus antenna designers often settle for a non-50-ohm impedance across the full operating band, accepting a voltage standing wave ratio (VSWR), a measure of reflected signal, that is not 1.0:1 as for a perfect match, but instead in the range of 2.0:1 to 3.0:1, or even higher. The "hand effect" illustrated in FIGS. 1A and 1B can cause a degradation of VSWR from this design value to 6.0:1 or even 9.0:1 at the output of the power amplifier, node 416. This can appear at the input 420 of the power amplifier as a VSWR in the range of 2:1 to 3:1 even though at the designed operating point the VSWR at 420 would be closer to 1:1. Thus detecting a variation from nominal operating conditions at one of these upstream nodes can be used as an indication of deviation from impedance matching at the antenna. In particular, the load current and/or voltage can be monitored at the output 418 of the power amplifier driver 408. Deviations from nominal operating points at node 418 for a given input condition and known gain and other parameter settings can be used as indications of deviation from a nominal antenna matching condition and be used as an error signal for closed-loop control of impedance matching parameters. An example will now be given of one embodiment realizing a transmitter with closed-loop control of impedance matching based on this principle.

Figure 5:
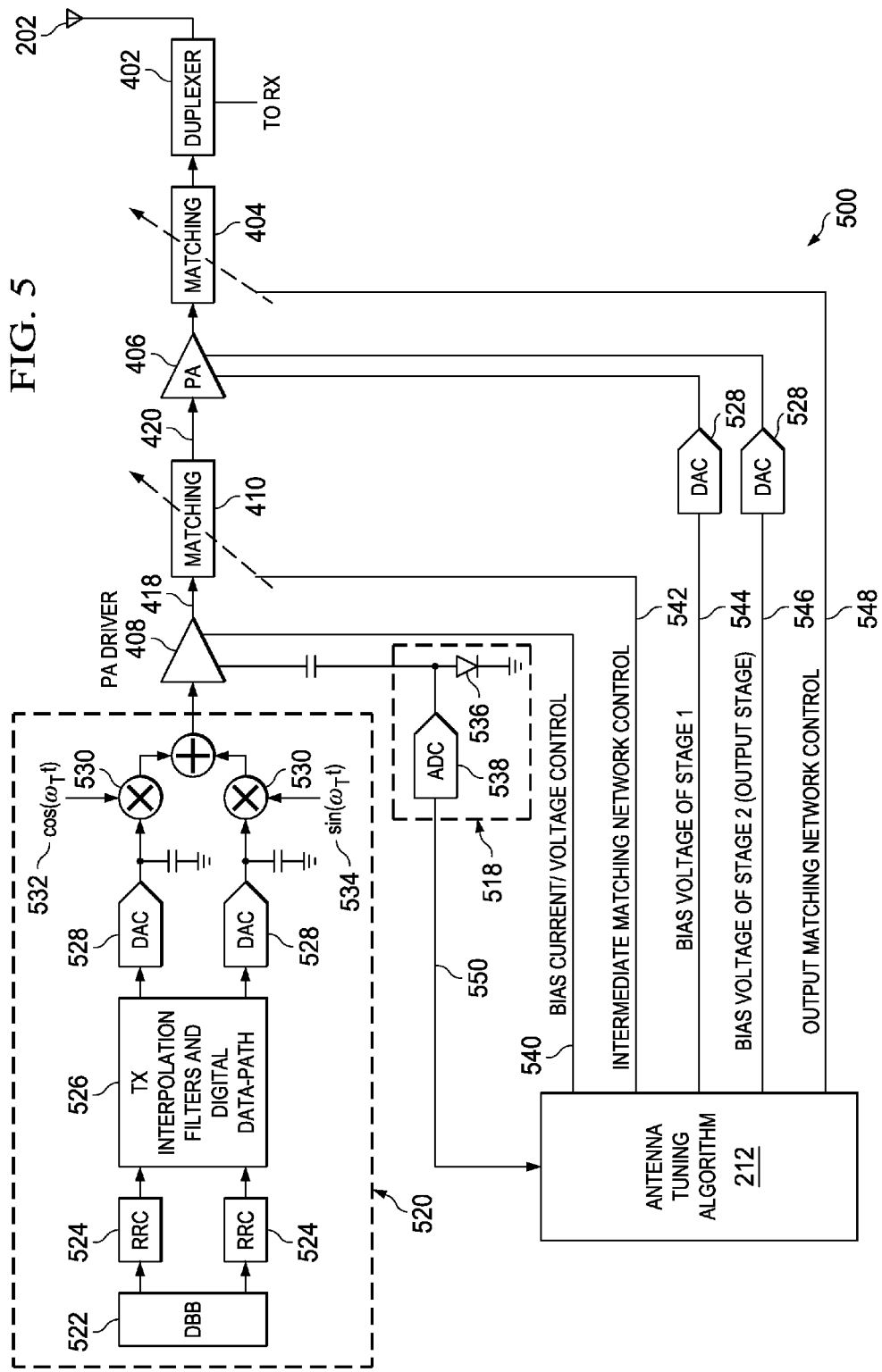
FIG. 5 is a schematic diagram depicting a transmitter with a detector according to one embodiment of the present invention.

Referring to FIG. 5, a schematic diagram of an exemplary transmitter 500 with antenna tuning according to a first embodiment of the present invention is shown. In this example, RF signals are generated for transmission by low-power RF circuitry in block 520. The illustrated circuit uses digital signal processing (DSP) technology to generate the analog RF signals presented to the input of power amplifier driver 408 in an example wideband code division multiple access (W-CDMA) system, although the present invention may be applied to many different types of wireless signals and systems. Digital baseband processor 522 generates two quadrature modulation outputs that are each filtered by root raised-cosine digital pulse shaping filters 524, further processed by transmit interpolation filters and associated DSP in block 526, followed by conversion from digital to analog by digital-to-analog converters (DACs) 528. The now-analog baseband modulation signals are mixed in mixers 530 with in-phase 532 and quadrature 534 RF frequency signals and added together to result in the modulated RF signal to be transmitted. This signal is applied to similar chain of amplifiers and matching networks to that just shown in FIG. 4. Mismatch at antenna 202 (or input of duplexer 402) propagates back through output matching network 404, power amplifier 406, and intermediate matching network 410 to appear at the output of power amplifier driver 408.

In this first embodiment, an error detector 518 derives an error signal from the amplitude of an RF load current of power amplifier driver 408. A typical RF signal has a maximum level of +6 to +10 dBm at the output of the power amplifier driver. This signal may be sensed directly at the output, or alternatively the current at a related internal node of the power amplifier driver, such as a total output stage drain current, may be mirrored to provide a scaled replica of the RF output of driver 408. An output of this type from PA driver 408 is shown emerging from the bottom of PA driver 408, a blocking capacitor is shown between PA driver 408 and error detector 518 to prevent DC bias currents from influencing the error signal, and a simple diode mixer 536 is shown as an exemplary means for detecting the amplitude of the RF output. Alternative amplitude detectors will be described later. An analog-to-digital converter (ADC) 538 may be used to provide a digital output error signal at node 550 for input to a processor running an antenna tuning algorithm 212. Alternatively, ADC 538 may be omitted and control processing may be performed in the analog domain in block 212. In either case, the controller in block 212 may calculate an adjustment to one or more parameters that are to be altered in such a direction as to reduce the detected antenna mismatch. For this example, a digital controller is assumed. A number of possibilities for control outputs are shown in FIG. 5, not all of which need to be used. Adjustments can be made to one or both of matching networks 404 and 410 using signals 548 and 542, respectively. Alternatively, or additionally, it is to be noted that changes to parameters in the amplifiers that alter their operating points also alter their output impedance characteristics. For example, bias voltages for two stages of power amplifier 406 are shown being controlled by analog signals generated by DACs 528 in-line with digital control outputs 544 and 546. Adjustments to bias voltages or perhaps a power supply voltage at the power amplifier 406 might lower a VSWR from 6.0:1 down to 4.0:1. Similarly, signal 540 may be used to control bias currents or voltages in power amplifier driver 408.

Figure 6:
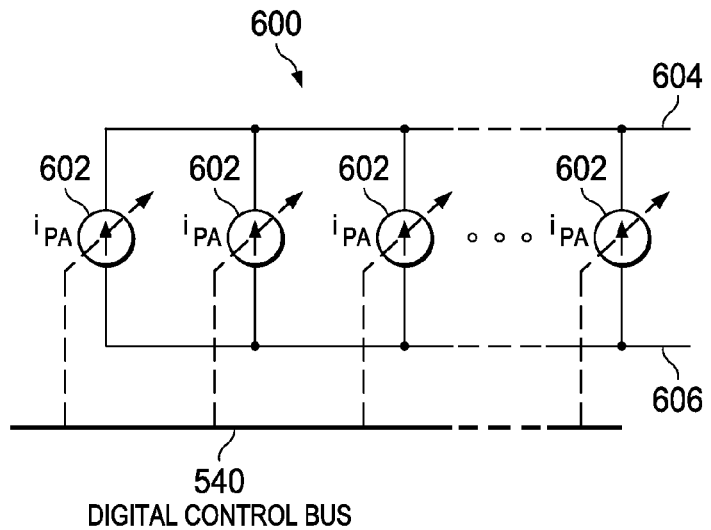
FIG. 6 is a simplified schematic diagram of a portion of an output stage of a digitally controlled power amplifier or power amplifier driver.

PA driver 408 can be constructed in different ways. It can be constructed as one linear RF amplifier stage, or as several RF amplifier stages that can be digitally combined to produce a larger drive strength with a programmable output gain or transconductance, $g_m$. In a traditional PA driver built using linear RF amplifier, the magnitude of the input analog signal determines the output drive of the PA driver, and control signal 540 may be a digital or analog signal to control e.g. bias currents or voltages within the PA driver gain stages. In a digitally-controlled PA driver, control signal 540 may be a digital signal that can select the output $g_m$ of the amplifier. An example of a digitally-controlled PA is given in R. B. Staszewski et al., U.S. Patent Application Publication, Pub. No. US 2005/0271161, published Dec. 8, 2005. Referring now to FIG. 6, a simplified diagram of an output stage 600 of a digitally-controlled amplifier is shown, which could be used within a PA driver or PA. A number of current driver output stages 602 are connected in parallel to drive output lines 604 and 606, the output current of which is a summation of the currents of those stages 602 that are enabled digitally by digital control bus 540, corresponding to the similarly-labeled controller output in FIG. 5. Each output stage 602 provides not just a simple DC current, but an RF current that is proportional to the RF signal at the input of the amplifier. Thus the output drive current strength or gain (transconductance, if the input is a voltage) is digitally programmable by control bus 540. Within a wireless transmitter system, the output drive will be controlled to achieve or maintain a particular radiated power level. Adjusting the output drive also affects the output impedance characteristics of the PA driver or PA. The digital control of output stages can therefore also be used as a tunable parameter for controlling impedance matching. When the PA driver output gain is adjusted to modify the impedance, then the overall RF signal amplitude can be adjusted at the input of the PA driver or by adjusting the PA gain in order to maintain a desired signal level.

When using a digitally-controlled power amplifier driver, an error signal suitable for use in the control or tuning algorithm can be derived from a manufacturing calibration procedure and the operating conditions as follows. Referring again to FIG. 5, when the transmitter is calibrated in the factory, a 50 ohm load or other known impedance may be placed at node 420 to be used as a reference impedance $Z_{in}$, and the intermediate matching network set to zero reactance. A calibration operation can then be performed to determine $Z_P$ for each code controlling the output $g_m$ in the case of a digitally-controlled PA driver (or for each input level of the PA driver, in the case of a linear PA driver), since $Z_L$ and other relevant parameters are known at calibration time. Referring again to FIG. 5, the control signal 540 input to PA driver 408 may be stepped through selected (or all) values, and the output of ADC 538 for each setting stored in a look-up table (LUT). During regular operation, when $Z_{in}$ is replaced by the varying load of an actual PA input that depends on the VSWR at the antenna, the voltage that is read at the ADC output differs significantly from the voltage that is measured at calibration. In particular, for the same code (or, in the case of a linear PA driver, magnitude of analog signal) applied to the PA driver (same output power), a different digital code is observed at the output of the detector ADC compared to the calibrated value (reference value). The difference of the two comprises an error signal that can be used by the controller 212 as a control input indicating deviation from a nominal impedance matching condition. The controller 212 then generates control outputs that may be used to adjust variable or programmable (tunable) parameters of the PA driver 408, intermediate matching network 410, power amplifier 406, or output matching network 404 (or any combination of the above) to reduce the detected impedance mismatch. The goal of the controller, which may use an adaptive algorithm, is to tune the parameters such that the magnitude of error signal is minimized, thereby achieving the best matching of the load impedance possible within the available range of the tunable parameters.

Continuing to refer to FIG. 5, the simple amplitude detector represented by diode mixer 536 can be replaced by various amplitude detectors of types known in the art, without departing from the spirit and scope of the present invention. Two examples are described next. As a first example, the function of mixer 536 may be performed by a Gilbert cell mixer with a local oscillator (LO) signal provided from the same source that provides LO signals 532 and 534 to the mixers 530 in low-power RF block 520. The mixer output can be digitized by ADC 538. More complex detection schemes for generating error signal 550 are also possible. As another example, mixer 536 may be replaced by a peak or envelope detector, for example, an analog peak or envelope detector. The output level of this envelope detector may be stored in a look-up table (LUT) during factory calibration for $Z_{in}$=50 ohms at node 420, or with a reference impedance at another node, for each output level of the PA driver. This stored envelope detector output constitutes a reference signal. During regular operation, the peak detector output is compared to a reference peak signal for the same settings of, and input to, the PA driver (e.g. digital representation applied to the DACs) and the difference in the absolute powers is interpreted as the error signal. One exemplary way this comparison might be implemented is by having the tuning algorithm compute the intended output power from the digital domain circuits by accessing the in-phase and quadrature (I and Q) signal data and passing the complex envelope through a digital envelope detector to synthesize a digital peak signal. This synthesized signal is then compared with the entries from the calibration LUT and provides a means for estimating the waveform that should be observed at the analog peak/envelope detector output under perfect matching (50 ohm). When the match moves to a sub-optimal point, the difference between the outputs of the analog peak/envelope detector and the digital peak/envelope detector may be used as an error signal that can be driven to zero in a mean square sense by the antenna tuning algorithm in controller 212, by adjusting parameters that affect the matching conditions.

During design or calibration, DC offsets due to temperature variations can also be taken into account. The contribution of the detector offset due to temperature changes can be determined either by simulation or by characterization. For example, during calibration, the DC offset at the output of ADC 538 may be subtracted output from each reading. If there is a dependency of DC offset with temperature, it is noted directly in a look-up table or stored as a mathematical abstraction as a formula for subsequent correction during the regular operation of the transceiver. Then using a reading from an on-chip temperature sensor as an input to the control algorithm, this contribution can be removed from the reading obtained at the ADC output during operation. An example of a simple temperature sensor is a ring oscillator which changes its frequency with temperature. The measured frequency can be used to deduce temperature within the circuit.

Figure 7A:
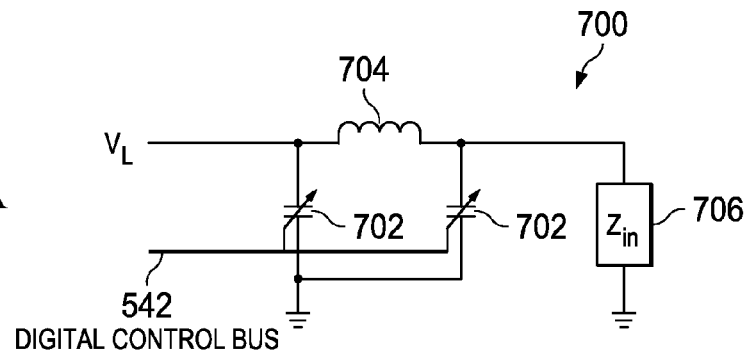
FIG. 7A is a schematic diagram of a digitally-controlled impedance matching network configured as a pi network.
Figure 7B:
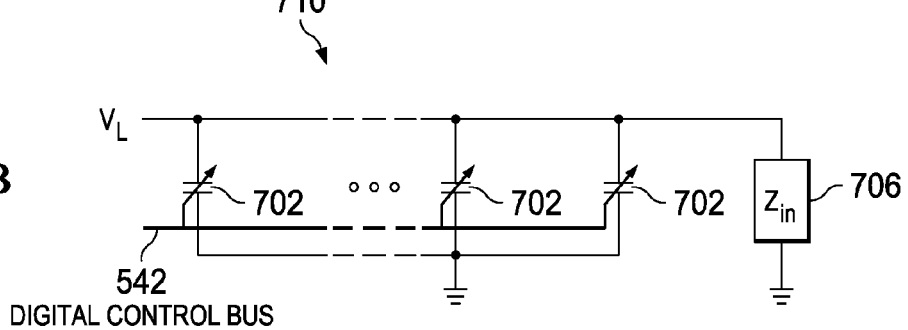
FIG. 7B is a schematic diagram of a digitally-controlled impedance matching network configured as an array of digitally switched capacitors.

Referring now to FIG. 7A, a schematic diagram is shown of a programmable matching network 700 that is suitable for use either as an intermediate matching network 410 [etc.] 410 or output matching network 404 in transmitter 500. Matching network 700 takes the form of a pi network with two digitally variable or programmable capacitors to ground that can be programmed in response to digital control bus 542, flanking an inductor 704. As an example application, matching network 700 is shown coupled to match power amplifier input impedance $Z_{in}$ 706 in order to exhibit a combined impedance $Z_L$ that is presented to the output of PA driver 408 at node 418 as described earlier. Digitally-programmable capacitors can be constructed using a number of individual capacitors that are arrayed and digitally selectable. In an alternate implementation, each capacitor may be a varactor with its own control voltage converted by a DAC to an analog form. There are other possible topologies for matching networks such as T networks or more complex configurations. Matching networks may also be formed as sections of a transmission line with reactive properties and programmed by switches that, when turned on, change the impedance of the transmission line without producing a shunt path that could result in loss of signal power. Another example of a programmable matching network 710 is shown in FIG. 7B, which may consist simply of an array of digitally-controllable capacitors 702 switched in and out using digital control bus 542. An even simpler alternative can be a single varactor controlled by a DAC output to provide digital control. For a matching network containing only capacitance, a simple exemplary tuning algorithm such as the following may be used by controller 212: if increasing the matching network capacitance increases the error signal, the algorithm reduces the capacitance as long as the magnitude of error signal keeps decreasing. Similarly, if decreasing capacitance increases the error signal, the algorithm increases capacitance as long as the magnitude of the error signal keeps decreasing.

The reactive part of antenna impedance may change more in response to changes in environment than the resistive (real) part. Thus detecting a change in phase shift between RF voltage and current at the sensed node may provide a more sensitive response to changes in mismatch than sensing the signal amplitude. A second embodiment is next described using a detector circuit capable of generating an error signal based on the relative phase between voltage and current within the transmitter's antenna drive circuit.

Figure 8:
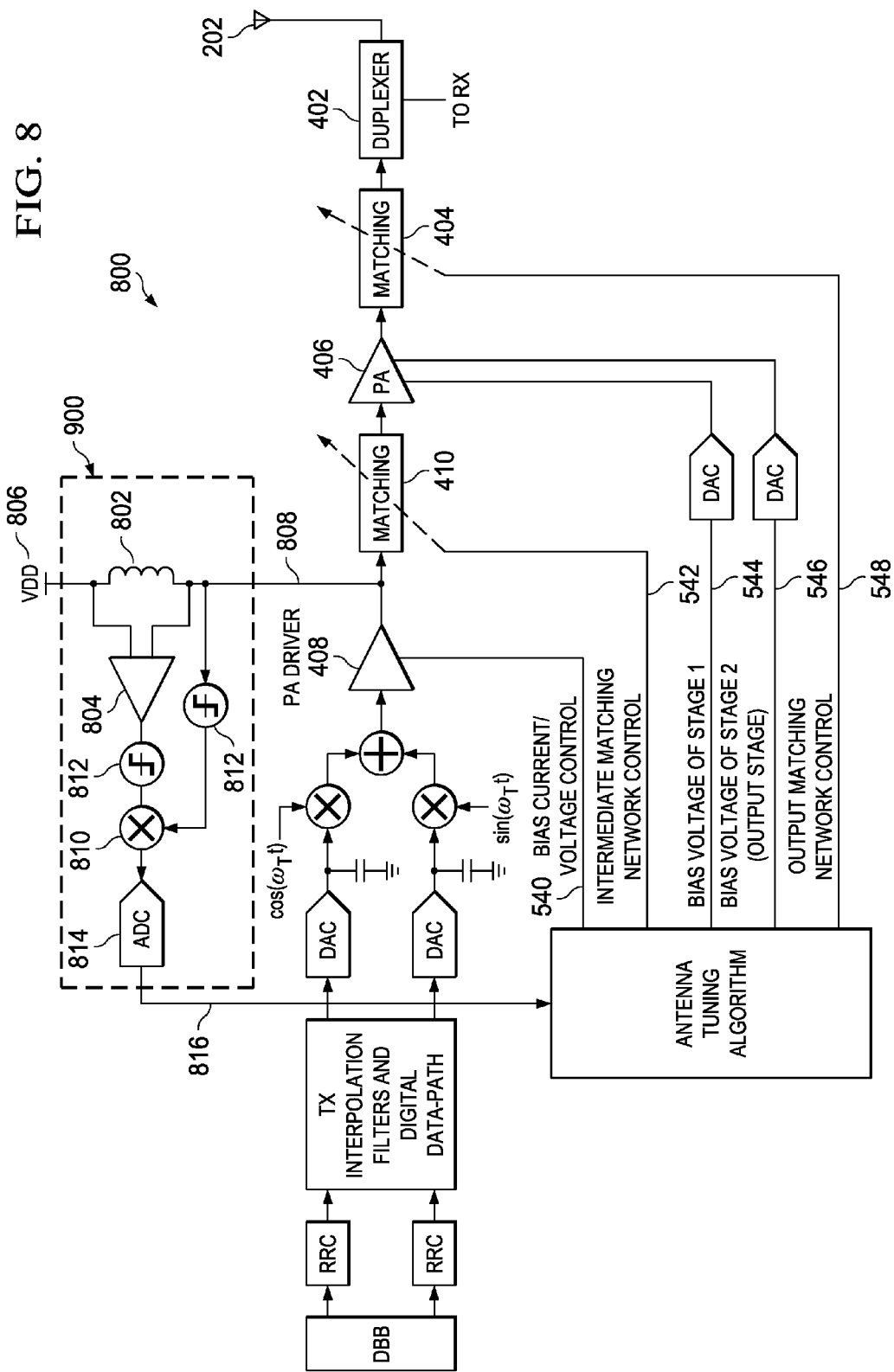
FIG. 8 is a schematic diagram depicting a transmitter with a detector according to another embodiment of the present invention.

Referring now to FIG. 8, a schematic diagram is shown of a transmitter 800 according to a second embodiment of the present invention. A detector 900 is shown that is capable of generating an error signal based on the relative phase between the RF voltage and current at node 808. To do so, a voltage difference is sensed across choke or inductor 802, where the voltage difference is developed in response to an RF load current flow from supply node 806 at voltage $V_{DD}$ to a point in the antenna drive chain, here shown at the output of PA driver 408. The same type of detector could sense the RF signal elsewhere, for example at the output of intermediate matching network 410 or at the output of power amplifier 406. The detector 900 as shown uses a differencing amplifier 804 to sense the current through the choke inductor 802 and picks off the voltage at node 808. Limiters 812 and mixer 810 are used to generate an analog baseband signal indicative of the relative phase between the sensed voltage and current. This analog baseband signal may be used directly as an error signal, or as shown in FIG. 8, an ADC 814 may be used to convert the analog signal to a digital one 816 that serves as an error signal input into the tuning controller 212. As in the first embodiment, controller 212 can produce one or more control output signals 540, 542, 544, 546, and 548 that can be used to adjust variable or programmable parameters in one or more of circuit elements PA driver 408, intermediate matching network 410, power amplifier 406, or output matching network 404.

Figure 9:
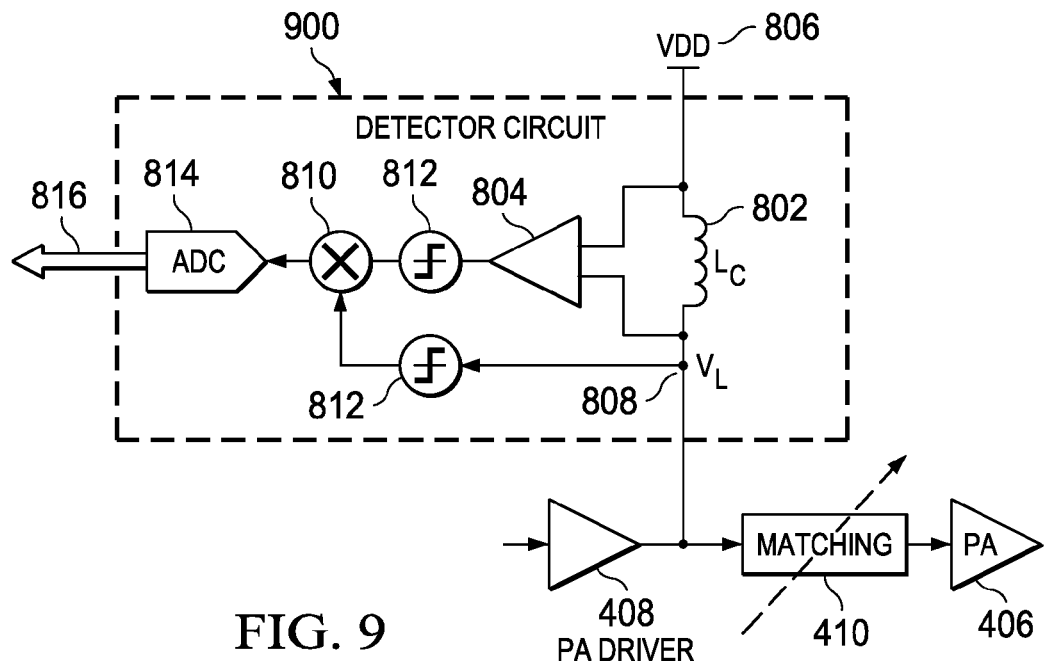
FIG. 9 is a schematic diagram showing a detail of the detector portion of a transmitter according to an embodiment of the present invention.

The principle of operation of exemplary detector 900 will now be described with reference to FIG. 9, which is a schematic showing a detail of detector 900 according to an embodiment of the present invention. The detector produces a deterministic output as a result of RF mismatch at the antenna, as manifested in a phase shift of voltage with respect to current. This circuit uses multiplication by mixer 810 of a limited form of the RF current and voltage across the choke inductor 802 to produce a baseband signal. The purpose of limiters 812 is to remove amplitude information and retain only phase information from the RF signals. The output of the mixer 810 is a baseband signal which depends on the phase difference of the RF voltage and current in the RF choke. When the two signals are in phase, maximum output is produced. When the two signals are orthogonal, zero output is produced. At intermediate phase shifts, the output varies monotonically between minimum and maximum according to a cosine function. The down-converted baseband signal may be converted from analog to digital by ADC 814 to form a digital output 816. The baseband signal changes with the load current driven by the PA driver, and in particular indicates deviations from perfect impedance matching.

Figure 10A:
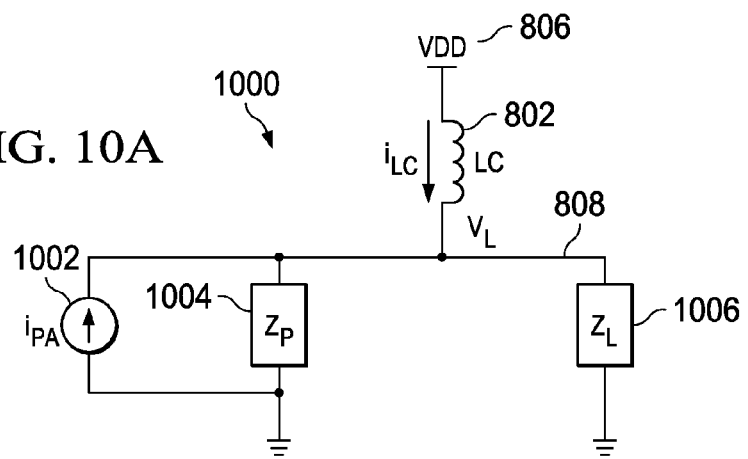
FIGS. 10A and 10B are schematic diagrams of equivalent circuits for the detector shown in FIGS. 8 and 9 according to an embodiment of the present invention.
Figure 10B:
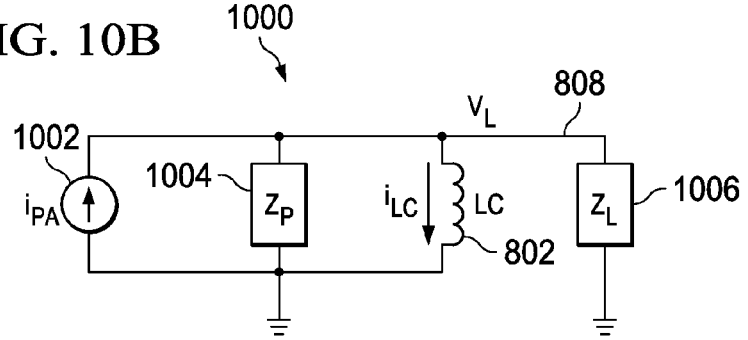

Two versions of an equivalent circuit 1000 are provided in FIGS. 10A and 10B of the portion of detector circuit where RF signals are sensed to further explain operation of detector 900. FIG. 10A shows a simplified schematic of an equivalent circuit 1000 at the output of PA driver 408. The output stage of PA driver 408 is modeled by current source 1002 and output impedance 1004. The combined load impedance of matching network 410 and power amplifier 406 is represented by impedance 1006 to ground. For simplicity, load impedances related to difference amp 804 and limiter 812 are not shown. Load voltage $v_L$ appears at node 808, and current $i_{LC}$ is shown through choke 802 with inductance $L_C$. Because supply node 806 at $V_{DD}$ is an AC or RF ground, the circuit may be redrawn for RF analysis as FIG. 10B. Now using the superposition theorem, the RF current $i_{LC}$ through the choke 802 is given as $$i_{LC} = \frac{Z_P \parallel Z_L}{j \cdot X_{LC} + Z_P \parallel Z_L}.$$

Also, the RF voltage $v_L$ is given by $$v_L = i_{PA}(Z_P \parallel j \cdot X_{LC} \parallel Z_L).$$

where the symbol $\parallel$ represents parallel combination according to convention. When the load is perfectly matched, then $Z_L = R_L$, i.e. the load impedance is purely resistive, and it looks like a load resistor with zero reactance. Thus at perfect match, the voltage and current across the load impedance are in phase with each other. Otherwise, $Z_L = R_L + j \cdot X_L$, where $X_L$ represents a nonzero reactive part of the load impedance, and there is as a result a phase shift between the voltage and current.

Figure 11:
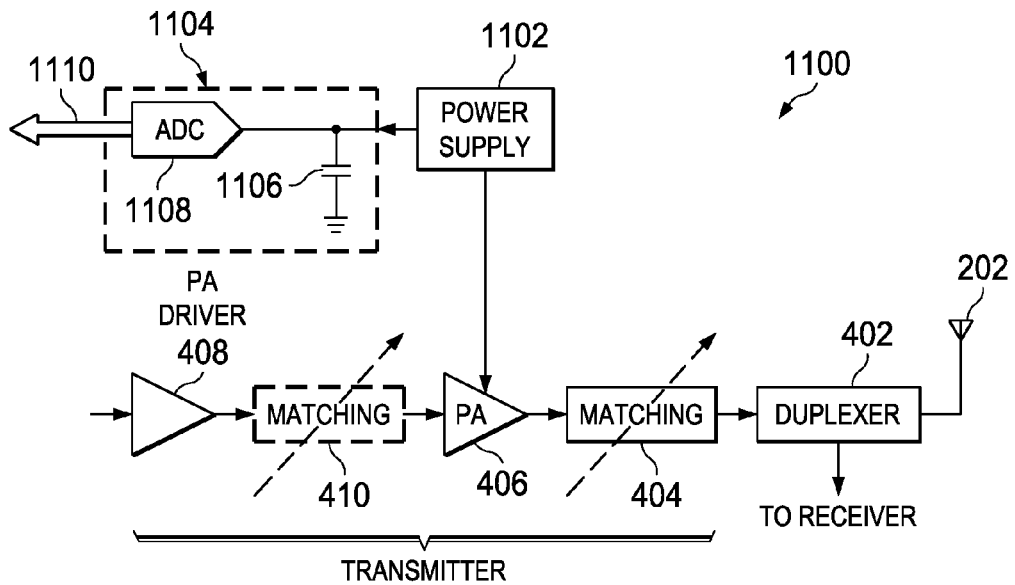
FIG. 11 is a schematic diagram of a transmitter using a detector according to yet another embodiment of the present invention.

Referring now to FIG. 11, a transmitter 1100 with antenna tuning based on a third alternative detector is shown that makes use of the properties of modern compact power supplies and the fact that significant differences in supply current result in the presence of antenna mismatch, especially for the power amplifier 406. Detector 1104 functions according to the following principle: if the PA 406 is supplied by a pulse-width modulated DC-DC converter or switching mode power supply (SMPS) 1102, the duty cycle of the pulse width modulator in the power supply translates to the output voltage that in turn produces the output power produced by the PA 406. Under a mismatch condition, for the same power delivered to the load, the duty cycle of the SMPS 1102 DC-DC converter increases from that measured for a perfect load (1:1 VSWR) or lower mismatch. This may be because the base-station receives less power due to antenna mismatch and through radio resource management (RRM) commands requests the transmitter to increase its output power. The output power can be increased by increasing the duty cycle of the SMPS 1102 so that the PA 406 is connected to the battery more often. This duty cycle increase, when compared to the reference duty cycle measured for 50 ohm loading (stored in a look-up table during calibration) provides an insight into the amount of mismatch present at the antenna. The higher the mismatch, the harder the PA 406 is driven as compared to when it is driving a perfectly matched load. The supply duty cycle of the pulse width modulator circuit in the SMPS 1102 DC-DC converter can be measured using a simple circuit. An analog method is to charge a small capacitor 1106 and measure the voltage that appears on it using an analog-to-digital converter 1108 to provide a digital output 1110 that is sent to a controller. Capacitor 1106 is a schematic representation of a number of ways of providing a low-pass filter or integration function to generate a DC voltage related to the duty cycle of the power supply 1102. Alternatively, a completely digital version of the detector 1104 can be implemented. For example, a high speed clock can sample a digital signal within SMPS 1102 to estimate the duty cycle. The change in duty cycle from a duty cycle measured at calibration represents the error signal. The matching network 404 or other tunable parameters of transmitter 1100 may be tuned by the tuning algorithm to reduce the magnitude of error signal to zero or as close to zero as possible. For example, the algorithm may tune the values of the matching network such that the measured duty cycle is lowered. This same type of detector could be applied to PA driver 408, but lower-power stages have a less dramatic effect on supply voltage or current measured at the power supply.

Many alternatives exist for control or tuning algorithms to be used in implementing the tuning controller and that will be familiar to those skilled in the art. Preferably, an adaptive algorithm is used that is able to adjust its control parameters automatically to optimize performance and in response to changes in the environment. This type of algorithm may achieve higher accuracy of control and possibly adjust more quickly to recover from disturbances than simpler control schemes. An example of a type of algorithm that is suitable for use with the present invention is a least-mean-square (LMS) algorithm which finds abundant use in commercial electronics due to its simplicity and robustness.

For optimum performance, multiple detectors may be used to generate multiple error signal inputs to the tuning algorithm. For example, there may be two error detectors, one at the PA driver output and a second at the PA output, with the first sensing mismatch at PA output and the second sensing mismatch at the PA driver output. The adaptive tuning algorithm may then use both these inputs to calculate an adjustment. As described earlier, multiple control outputs may also be provided to optimize power transfer to the antenna. For example, if two programmable matching networks are available, an intermediate matching network and an output matching network, then they can be controlled to minimize the mismatch. It is also possible for the tuning algorithm to adjust multiple parameters based on an error signal from a single detector. For example, referring again to FIG. 8, an error signal 816 is generated by detector 900 based on signals at node 808. A nested series of control loops may be implemented by controller 212. Take for example the case in which four control outputs 542, 544, 546, and 548 are all to be used to adjust tunable parameters in transmitter 800, and four nested control loops are to be implemented. Since the mismatch appears first at the antenna 202, the matching control adjustments preferably start closest to the antenna 202. The four control loops share the error signal 816 from the detector 900, i.e. there is only one error signal regardless of where the mismatch occurs within transmitter 800. An example tuning sequence is as follows. First the output matching network 404 is programmed using signal 548 to obtain the smallest magnitude of error signal. Next the controls 544 and 546 for power amplifier 406 are exercised to reduce the magnitude of error signal further. Following that, the intermediate matching network 410 at the output of the PA driver 408 may be exercised to reduce the magnitude of error signal to a minimum. This entire sequence may be repeated periodically or in response to any change in error signal 816.

Figure 12:
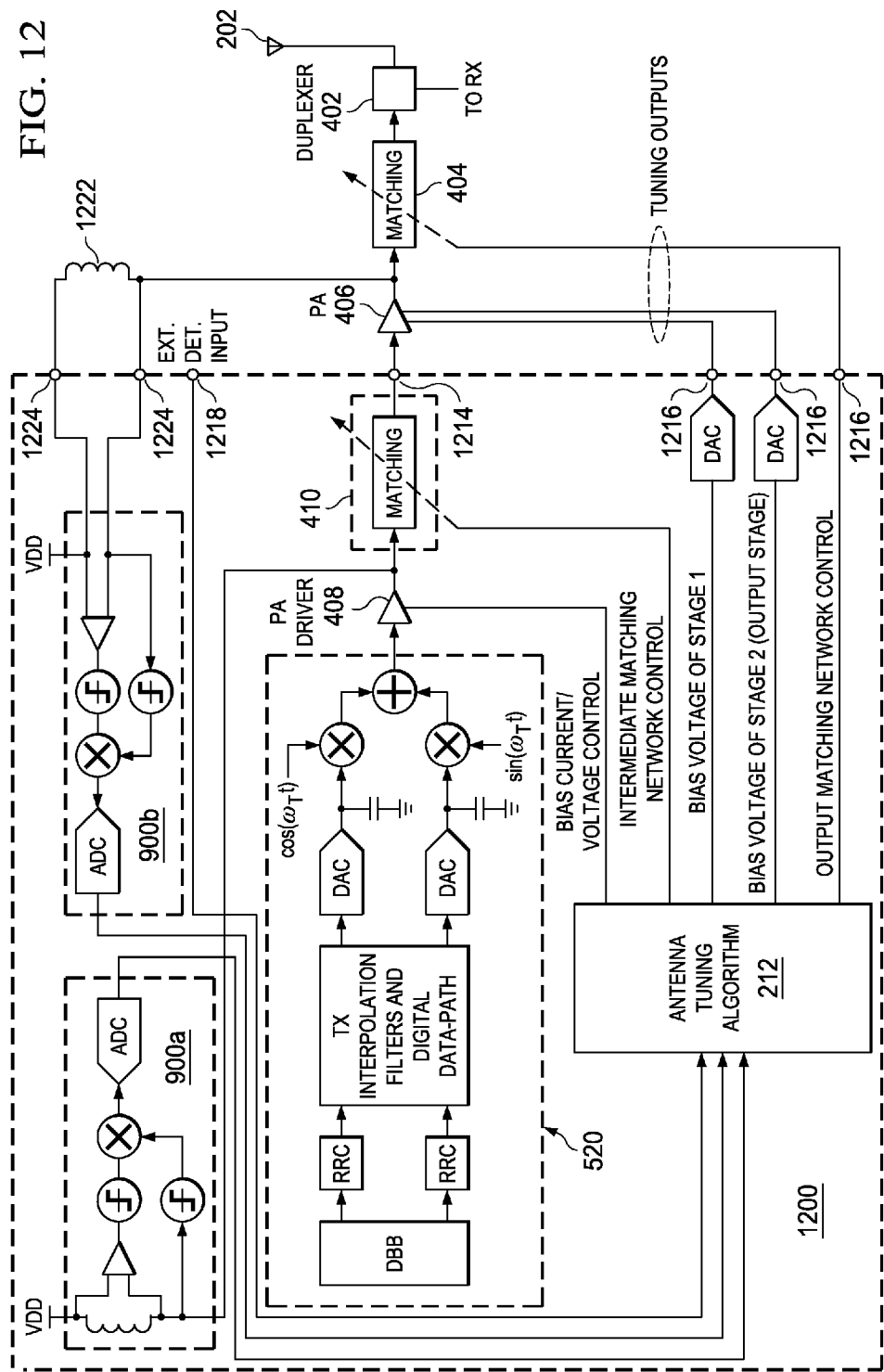
FIG. 12 is a schematic diagram of an integrated circuit device according to an embodiment of the present invention.

Referring now to FIG. 12, a schematic diagram of an exemplary integrated circuit device 1200 according to an embodiment of the present invention is shown. Portions of a transmitter with antenna tuning according to principles of this invention may be integrated into a single device of this type. Integration of multiple functions into a single package may be used to reduce the complexity and cost of a transmitter system. In the example shown, a digital baseband processor and associated RF modulation and signal generation electronics 520 using digital signal processing techniques as described previously may be integrated together with a power amplifier driver 408, an optional intermediate matching network 410, and detectors 900a and 900b and controller 212 used to implement antenna tuning according to the principles described previously. A number of inputs and outputs are shown in the example device 1200. As just described, multiple detectors may be used to generate suitable error signals for the controller 212 to act upon. In this example, two detectors are shown as part of device 1200. Detector 900a is shown sensing RF signal phase at the output of PA driver 408 internal to the integrated circuit. Detector 900b is provided to sense RF signal phase at the output of power amplifier 406 through input connections 1224. Because of the difficulty of integrating inductors, it may be desirable to accommodate connections to an external choke inductor 1222 instead of integrating a choke together onto the same semiconductor die as the detector circuitry 900b. This scheme might apply as well to detector 900a even though detector 900a is shown sensing a signal internal to integrated circuit device 1200. External detectors may also be provided for additional error signal inputs or higher performance than the internal detectors, and an external detector input 1218 may be provided to accept signals from them. Finally, in addition to control signals connected to adjust parameters of internal circuitry such as PA driver 408 and intermediate matching network 410, tuning outputs 1216 may be provided in order to connect analog or digital control signals to external elements such as PA 406 and output matching network 404.

Figure 13:
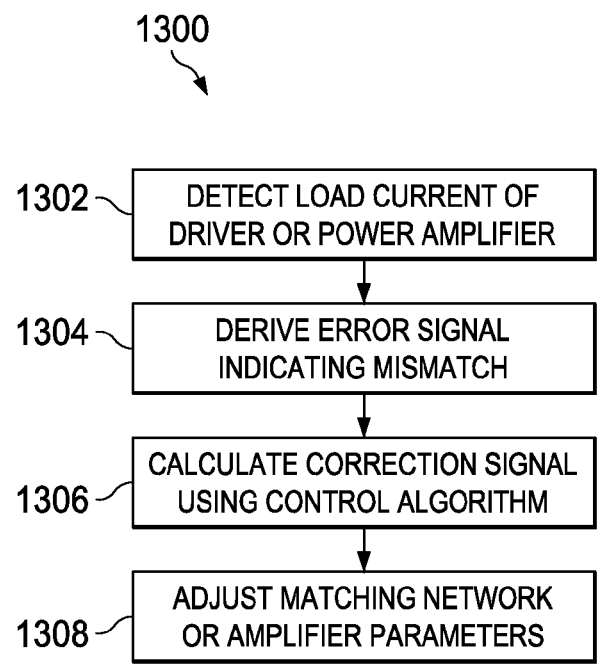
FIG. 13 is a flow chart depicting a method for tuning a transmitter in accordance with another embodiment of the present invention.

A flow chart depicting a method 1300 of tuning a transmitter in accordance with the present invention is shown in FIG. 13. The basic steps in implementing control of antenna impedance matching in response to signals detected in the transmitter are shown. Variations of this method have also been described above with reference to particular hardware implementations of the method. First a load current is detected in block 1302, which may be sensed for example at the output of a PA driver or a power amplifier. Next, an error signal is derived in block 1304 based on the detected signal and that indicates a mismatch of antenna impedance from a nominal or calibrated value. Then a control or tuning algorithm is used in block 1306 to calculate a correction signal based upon the error signal that was derived in block 1304. Finally, outputs from the control or tuning algorithm are used in block 1308 to adjust tunable parameters in the transmitter such as programmable matching network settings or operating parameters of an amplifier, such that a deviation from the predetermined impedance matching condition is reduced. This method of tuning therefore results in an improved antenna match, leading to better performance of the transmitter and the associated advantages as heretofore described.

Although a variety of types of error detectors measuring the amplitude or phase, or both, of a load current of a power amplifier driver circuit or of a power amplifier, or both, have been described, and multiple tunable parameters have been listed that can be used to adjust impedance matching conditions, and different types of components and combinations of components into integrated subsystems have been shown herein, it will be apparent to those skilled in the art that the principles taught herein may be implemented in many other ways and by using different components and levels of integration. In addition, various hardware, software, and firmware implementations of control systems and control or tuning algorithms may be implemented in a controller and applied to perform the functions of calculating corrections and adjusting the tunable parameters to reduce the impedance mismatch. Such a controller can operate with inputs from one or more detectors, can control one or more tunable parameters, and can have fixed control laws, or be adaptive to self-optimize its operation, and/or to adjust to time-varying aspects of the system or of the environment in which it is working.

A number of advantages provided by the present invention will be readily apparent to those skilled in the art. By eliminating the directional coupler commonly used in mismatch sensors, the size, cost, and insertion loss of a transmitter may be reduced by the present invention, and more components may be integrated together. In less critical, lower-cost applications, one or both of the output or intermediate matching networks may also be eliminated, or replaced by smaller, simpler, and less costly fixed matching networks, with a tunable matching function performed by the adjustment of bias or supply voltages in the power amplifier driver or power amplifier. This adjustment of bias voltages and internal circuit parameters may be performed more quickly than switching or tuning of some types of programmable matching networks, enabling fast switching between bands or between receive and transmit operation. Eliminating or integrating components can lead to lower insertion loss and higher reliability as well as lower cost. Improving instantaneous impedance matching conditions through dynamic adjustment and lower insertion loss both lead to lower power dissipation of the transmitter, and thus result in improved battery life of a system including the transmitter. Increased power efficiency and simplicity are primary advantages of the present invention.

The present invention will be found to be particularly useful in handheld, portable and mobile wireless transceivers such as cell phones, smartphones and personal digital assistants (PDAs), mobile internet appliances, email terminals, wireless local area network (WLAN), personal area network such as Bluetooth®, and wide area network terminals, multimedia, mobile television, and mobile gaming devices, FM transmitters, and certain global positioning system (GPS) and other satellite systems. It should also be appreciated that such a transceiver system is representative of only one suitable environment for use of the invention, and that the invention may be used in a multiple of other environments in the alternative. The invention should therefore not be limited to the particular implementations discussed herein.

Although preferred embodiments of the present invention have been described in detail, it will be understood by those skilled in the art that various modifications can be made therein without departing from the spirit and scope of the invention as set forth in the appended claims.

I claim:

1. In a transmitter having one or more tunable parameters and comprising a power amplifier driver and a power amplifier, said power amplifier driver having an output coupled to an input of said power amplifier, and said power amplifier having an output coupled to an antenna, a method of tuning said transmitter comprising the steps of:
   detecting a first load current of said power amplifier driver;
   deriving an error signal from said first load current indicating a deviation from a predetermined impedance matching condition between said transmitter and said antenna;
   calculating a correction based upon said error signal; and
   adjusting one or more of said tunable parameters in accordance with said correction so as to reduce said deviation.

2. The method as recited in claim 1, further comprising the step of performing a calibration while said output of said power amplifier driver is connected to a known load impedance.

3. The method as recited in claim 1, further comprising the step of performing a calibration while said output of said power amplifier is connected to a known load impedance.

4. The method as recited in claim 2, wherein the step of performing a calibration includes storing a baseline error signal as a function of temperature.

5. The method as recited in claim 3, wherein the step of performing a calibration includes storing a baseline error signal as a function of temperature.

6. The method as recited in claim 1, wherein the step of detecting comprises down-converting to baseband a replica of an RF output current of said power amplifier driver.

7. The method as recited in claim 1, wherein said error signal is derived from an amplitude of said first load current.

8. The method as recited in claim 1, wherein the step of detecting comprises detecting a first load current of said power amplifier driver and a first load voltage associated with said first load current, and generating a first signal indicating a phase relative to said first load current of said first load voltage, and the step of deriving comprises deriving an error signal from said first signal indicating a deviation from a predetermined impedance matching condition between said transmitter and said antenna.

9. The method as recited in claim 1, wherein the step of detecting comprises detecting a first load current of said power amplifier.

10. The method as recited in claim 3, wherein the step of detecting comprises detecting a first duty cycle of a switching mode power supply that supplies said power amplifier, and the step of deriving comprises deriving from said first duty cycle an error signal related to a difference of said first duty cycle from a second duty cycle measured during said calibration and indicating a deviation from a predetermined impedance matching condition between said transmitter and said antenna.

11. The method as recited in claim 2, wherein said error signal comprises an error signal related to a difference of said first load current from a second load current measured during said calibration.

12. The method as recited in claim 3, wherein said error signal comprises an error signal related to a difference of said first load current from a second load current measured during said calibration.

13. The method as recited in claim 2, wherein said power amplifier driver comprises a digitally controlled amplifier having an output gain selected by a first digital code, and said error signal comprises an error signal related to a difference of said first digital code from a second digital code measured during said calibration.

14. The method as recited in claim 1, wherein said predetermined impedance matching condition corresponds to a purely resistive load impedance.

15. The method as recited in claim 14, wherein said purely resistive load impedance is 50 ohms.

16. The method as recited in claim 1, wherein the step of calculating comprises finding said correction corresponding to said error signal in a look-up table.

17. The method as recited in claim 1, wherein the step of calculating comprises applying an adaptive tuning algorithm to calculate said correction.

18. The method as recited in claim 17, wherein said adaptive tuning algorithm comprises a least-mean-square algorithm.

19. The method as recited in claim 1, further comprising an intermediate matching network connected between said output of said power amplifier driver and said input of said power amplifier.

20. The method as recited in claim 1, further comprising an output matching network connected between said output of said power amplifier driver and said antenna.

21. The method as recited in claim 1, wherein said tunable parameters comprise one or more parameters of said power amplifier driver selected from the group consisting of a bias voltage in one or more gain stages, and a supply voltage of said power amplifier driver.

22. The method as recited in claim 1, wherein said tunable parameters comprise one or more parameters of said power amplifier selected from the group consisting of a bias voltage in one or more gain stages, and a supply voltage of said power amplifier.

23. The method as recited in claim 19, wherein said tunable parameters comprise one or more parameters of said intermediate matching network selected from the group consisting of a value of a programmable capacitor, a value of a programmable inductor, and a switchable configuration of a transmission line.

24. The method as recited in claim 20, wherein said tunable parameters comprise one or more parameters of said output matching network selected from the group consisting of a value of a programmable capacitor, a value of a programmable inductor, and a switchable configuration of a transmission line.

25. A transmitter having one or more tunable circuit elements and an associated antenna, comprising:
   a power amplifier driver;
   a power amplifier having an input and an output, said input coupled to an output of said power amplifier driver, and said output being coupled to said antenna;
   a detector configured to sense a load current of one or both of said power amplifier driver and power amplifier, and to generate an error signal indicating a deviation of said load current from a predetermined value; and
   a controller configured to accept said error signal, calculate a correction based thereupon, and control one or more of said tunable circuit elements,
   whereby adjusting one or more parameters of said tunable circuit elements permits an impedance mismatch between said transmitter and said antenna to be reduced.

26. The transmitter as recited in claim 25, wherein said power amplifier driver comprises a digitally controlled amplifier having an output gain selected by a digital code.

27. The transmitter as recited in claim 25, wherein said detector comprises a mixer configured to down-convert to baseband a replica of an RF output current of said power amplifier driver, and to generate an error signal based on said down-converted replica, said error signal indicating a deviation of said RF output current from a predetermined value.

28. The transmitter as recited in claim 25, wherein said detector comprises a mixer configured to accept a first load current of said power amplifier driver and a first load voltage associated with said first load current, said mixer configured to generate a first signal indicating a phase relative to said first load current of said first load voltage, and to generate an error signal from said first signal indicating a deviation from a predetermined impedance matching condition between said transmitter and said antenna.

29. The transmitter as recited in claim 25, further comprising an intermediate matching network connected between said output of said power amplifier driver and said input of said power amplifier.

30. The transmitter as recited in claim 29, wherein said intermediate matching network is a tunable matching network comprising one or more elements selected from the group consisting of MEMS capacitors, digitally switched capacitor arrays, voltage tuned capacitors, programmable inductors, varactor diodes, and switched transmission lines.

31. The transmitter as recited in claim 25, further comprising an output matching network connected between said output of said power amplifier driver and said antenna.

32. The transmitter as recited in claim 31, wherein said output matching network is a tunable matching network comprising one or more elements selected from the group consisting of MEMS capacitors, digitally switched capacitor arrays, voltage tuned capacitors, programmable inductors, varactor diodes, and switched transmission lines.

33. An integrated circuit device for use in a transmitter system incorporating a power amplifier having one or more gain stages, an antenna, and at least one circuit element having one or more tunable parameters, said device comprising:
    a power amplifier driver circuit having one or more gain stages and an output;
    a detector circuit having an output and configured to sense a load current of said power amplifier driver and to generate an error signal indicating a deviation from a predetermined impedance matching condition; and
    a controller circuit connected to said output of said detector circuit, said controller circuit configured to adjust said tunable parameters, whereby a deviation from said predetermined impedance matching condition may be reduced.

34. The integrated circuit device as recited in claim 33, wherein said circuit element is said power amplifier driver circuit, and said one or more tunable parameters comprise a bias voltage in one or more of said gain stages of said power amplifier driver circuit, or a supply voltage of said power amplifier driver circuit.

35. The integrated circuit device as recited in claim 33, wherein said circuit element is said power amplifier, said power amplifier is external to said integrated circuit device and coupled to said output of said power amplifier driver, and said one or more tunable parameters comprise a bias voltage in one or more gain stages of said power amplifier, or a supply voltage of said power amplifier.

36. The integrated circuit device as recited in claim 33, wherein said circuit element is a programmable impedance matching network external to said integrated circuit device and connected between said power amplifier and said antenna, and said one or more tunable parameters comprise one or more parameters of said output matching network selected from the group consisting of a value of a programmable capacitor, a value of a programmable inductor, and a switchable configuration of a transmission line.

37. The integrated circuit device as recited in claim 33, further comprising a programmable impedance matching network coupled to said output of said power amplifier driver circuit, and said one or more tunable parameters comprise one or more parameters of said programmable impedance matching network selected from the group consisting of a value of a programmable capacitor, a value of a programmable inductor, and a switchable configuration of a transmission line.

\* \* \* \* \*